United States Patent
Mobley et al.

(10) Patent No.: US 11,105,834 B2
(45) Date of Patent: Aug. 31, 2021

(54) LINE-POWERED CURRENT MEASUREMENT DEVICE

(71) Applicant: Schweitzer Engineering Laboratories, Inc., Pullman, WA (US)

(72) Inventors: James Mobley, Moscow, ID (US); Raymond W. Rice, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 133 days.

(21) Appl. No.: 16/576,302

(22) Filed: Sep. 19, 2019

(65) Prior Publication Data

US 2021/0088561 A1 Mar. 25, 2021

(51) Int. Cl.
*G01R 19/00* (2006.01)
*G01R 15/18* (2006.01)

(52) U.S. Cl.
CPC ....... *G01R 19/0092* (2013.01); *G01R 15/183* (2013.01)

(58) Field of Classification Search
CPC .......................... G01R 19/0092; G01R 15/183
USPC ...................................... 324/127, 126, 76.11
See application file for complete search history.

(56) References Cited

U.S. PATENT DOCUMENTS

| | | | |
|---|---|---|---|
| 3,239,678 A | 3/1966 | Kolm | |
| 4,975,949 A * | 12/1990 | Wimsatt | H04M 1/312 |
| | | | 379/387.01 |
| 5,030,902 A * | 7/1991 | Mattinger | B26B 19/286 |
| | | | 320/114 |
| 5,293,323 A | 3/1994 | Doskocil | |
| 5,465,399 A | 11/1995 | Oberholtzer | |
| 5,608,306 A | 3/1997 | Rybeck | |
| 5,726,644 A | 3/1998 | Jednacz | |
| 5,861,684 A | 1/1999 | Slade | |
| 6,029,074 A | 2/2000 | Irvin | |
| 6,304,176 B1 | 10/2001 | Discenzo | |
| 6,492,910 B1 | 12/2002 | Ragle | |

(Continued)

FOREIGN PATENT DOCUMENTS

| WO | 2009009453 | 1/2009 |
|---|---|---|
| WO | 2009088652 | 7/2009 |

(Continued)

*Primary Examiner* — Giovanni Astacio-Oquendo
(74) *Attorney, Agent, or Firm* — Jared L. Cherry; Richard M. Edge

(57) ABSTRACT

The present disclosure pertains to a line-powered current measurement system to mount to an electrical conductor and related methods. In one embodiment, a system may comprise a current transformer to electrically couple to an electrical conductor and to generate a secondary current proportional to a primary current in the conductor. A power harvesting subsystem may harvest power from the secondary current in a first configuration. A switching subsystem may transition the line-powered current measurement device between the first configuration and a second configuration, in which a current measurement subsystem generates a measurement of the secondary current. The switching subsystem may provide the secondary current to the power harvesting subsystem in the first configuration and may bypasses the power harvesting subsystem in the second configuration. A communication subsystem may transmit the measurement of the secondary current to a receiver device.

20 Claims, 6 Drawing Sheets

(56) References Cited

U.S. PATENT DOCUMENTS

| | | |
|---|---|---|
| 6,657,418 B2 | 12/2003 | Atherton |
| 6,816,439 B1 | 11/2004 | Kawahara |
| 6,894,478 B1 | 5/2005 | Fenske |
| 7,060,379 B2 | 6/2006 | Speranza |
| 7,103,786 B2 | 9/2006 | Chen |
| 7,132,763 B2 | 11/2006 | Rendic |
| 7,170,194 B2 | 1/2007 | Korcharz |
| 7,274,168 B2 | 9/2007 | Tskukamoto |
| 7,315,169 B1 | 1/2008 | Fenske |
| 7,382,272 B2 | 3/2008 | Feight |
| 7,339,353 B1 | 4/2008 | Masias |
| 7,369,950 B2 | 5/2008 | Wall |
| 7,385,374 B2 | 6/2008 | Frantz |
| 7,398,101 B2 | 7/2008 | Zinn |
| 7,411,371 B2 | 8/2008 | Hobbs |
| 7,667,482 B2 | 2/2010 | Mort |
| 7,948,352 B2 | 5/2011 | Tang |
| 7,983,230 B1 | 7/2011 | Li |
| 8,103,463 B2 | 1/2012 | Kalgren |
| 8,650,411 B2 | 2/2014 | Feight |
| 9,386,529 B2 | 7/2016 | Swartzendruber |
| 2001/0054878 A1 | 12/2001 | Odaohhara |
| 2003/0020332 A1 | 1/2003 | Giannopoulos |
| 2003/0111908 A1 | 6/2003 | Christensen |
| 2004/0036359 A1 | 2/2004 | Griffith |
| 2004/0078606 A1 | 4/2004 | Chen |
| 2004/0256915 A1 | 12/2004 | Phinney |
| 2005/0006956 A1 | 1/2005 | Shi |
| 2005/0253560 A1 | 11/2005 | Popescu-Stanesti |
| 2007/0269219 A1 | 11/2007 | Teller |
| 2008/0122518 A1 | 5/2008 | Besser |
| 2008/0174278 A1 | 7/2008 | Masias |
| 2008/0287082 A1 | 11/2008 | Govindswamy |
| 2009/0243796 A1 | 10/2009 | Tieman |
| 2010/0013632 A1 | 1/2010 | Salewske |
| 2011/0001485 A1 | 1/2011 | Feight |
| 2013/0301683 A1 | 11/2013 | Sinsuan |
| 2019/0324075 A1* | 10/2019 | Kinsella ............... G01R 27/02 |
| 2020/0309823 A1* | 10/2020 | Beiner ................ G01R 15/181 |
| 2020/0408810 A1* | 12/2020 | Martel .............. G01R 19/0023 |
| 2021/0012626 A1* | 1/2021 | Volkerink ............... G08B 5/36 |

FOREIGN PATENT DOCUMENTS

| | | |
|---|---|---|
| WO | 2010020833 | 2/2010 |
| WO | 2010027343 | 3/2010 |

* cited by examiner

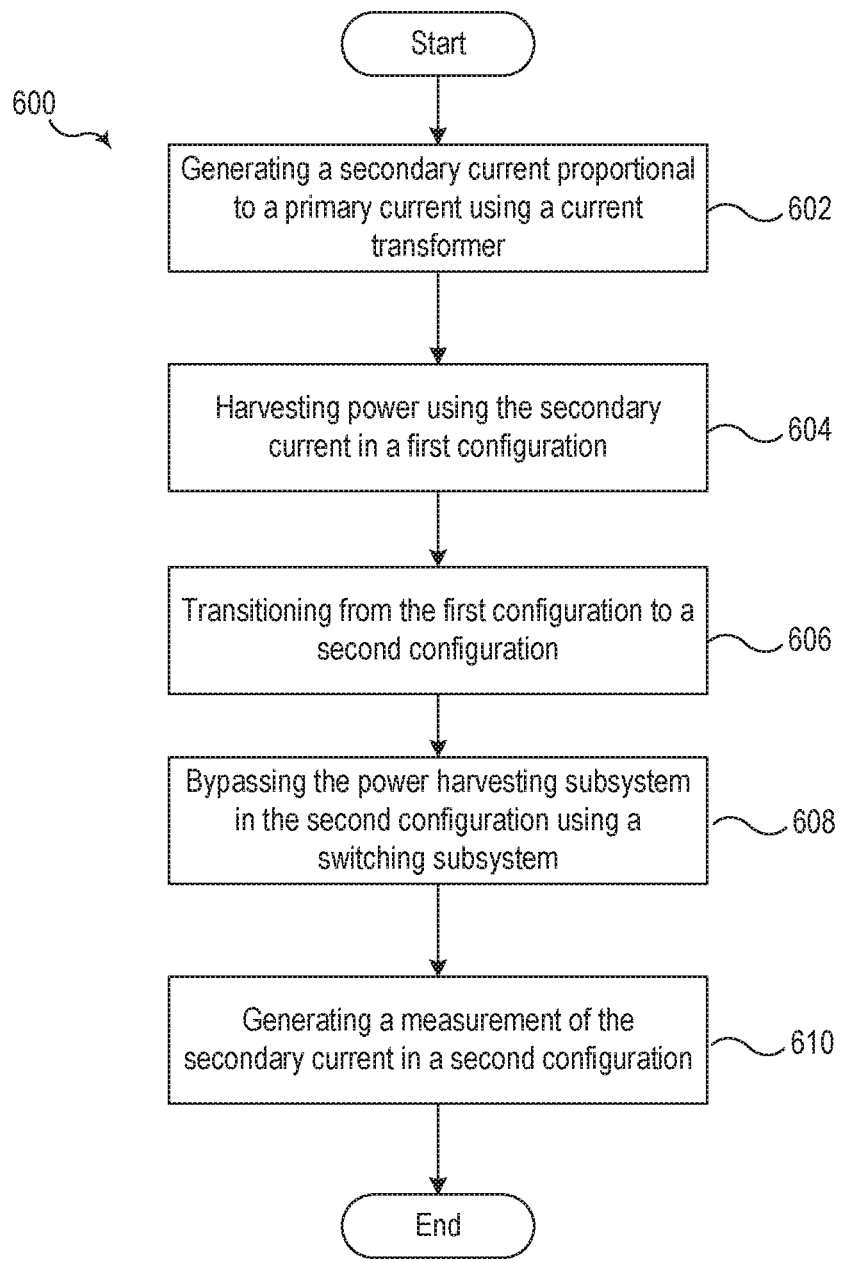

LINE-POWERED CURRENT MEASUREMENT DEVICE

TECHNICAL FIELD

This disclosure relates to devices, systems, and methods for harvesting power from electrical conductors. More particularly, but not exclusively, devices, systems, and methods consistent with the present disclosure may be used to improve the accuracy of current measurements in line-powered devices used to monitor electrical power systems.

BRIEF DESCRIPTION OF THE DRAWINGS

Non-limiting and non-exhaustive embodiments of the disclosure are described, including various embodiments of the disclosure with reference to the figures, in which:

FIG. 6 illustrates a flow chart of a method for operating a line-powered current measurement device in a first configuration, in which a current transformer provides power to a power harvesting subsystem, and a second configuration, in which the power harvesting subsystem is bypassed and current from the current transformer is measured by a current measurement subsystem, consistent with embodiments of the present disclosure.

DETAILED DESCRIPTION

Figure 1:
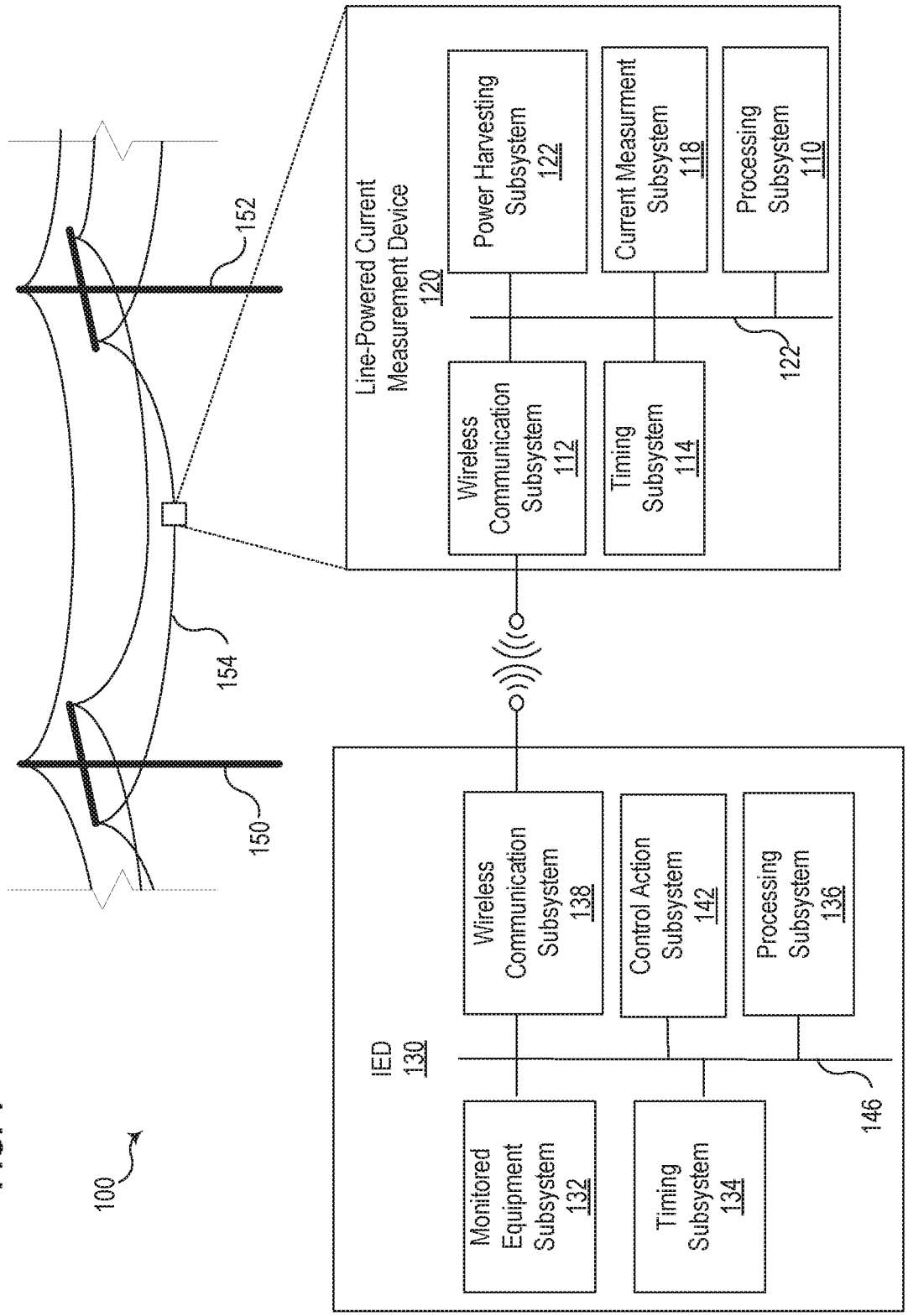
FIG. 1 illustrates a simplified representation of a system comprising a line-powered current measurement device mounted to an electrical conductor and an intelligent electronic device (IED) consistent with embodiments of the present disclosure.

Line-powered devices may be used in a variety of applications and offer the advantage of drawing power from an existing power source. The ability to power a device directly from an existing power source, such as an electrified conductor, may facilitate installation in existing systems or distributed systems. Such devices may be particularly useful in electric power systems for monitoring electrical parameters, such as current.

Various embodiments consistent with the present disclosure may incorporate an inductive device used to both draw power from the line and to sense electrical parameters of the current flowing through the line; however, the load produced by a power harvesting subsystem may decrease the current-sensing accuracy of the device. The inventors of the present application have recognized that certain advantages may be obtained by bypassing a power harvesting subsystem while measurements are being made. Such advantages include improving the accuracy of the resulting measurements, avoiding the need for multiple inductive devices, and reduced power consumption, among other things.

A variety of techniques and methods may be used to measure electric current consistent with the present disclosure. The selection of a current-sensing method may depend on requirements such as, for example, magnitude, accuracy, bandwidth, robustness, cost, isolation, and size, among other factors. Devices that may be used for current sensing may include, but are not limited to, shunt resistors, current transformers, Rogowski coils, hall effect sensors, flux gate sensors, magneto-resistive current sensors, etc.

An inductively coupled device, such as a current transformer, may be used to reduce or multiply an alternating current (AC). The current transformers may produce a current in a secondary winding that is proportional to the current in its primary winding. Current transformers may present a negligible load to the primary circuit. As such, current transformers are suited for current sensing for electrical power systems and may be used in power generation stations and electrical substations, and may be used in control systems associated with electrical motors, power transformers, power transmission and distribution lines, circuit breakers, switches, buses, transmission lines, voltage regulators, capacitor banks, and the like.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Various embodiments of digital signal generators and other devices or systems discussed herein may include various software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types. For example, in some embodiments, a digital signal generator may include computer instructions for performing the task of delivering low and high-level signals.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments of the digital signal generators or other devices and systems may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments of the digital signal generators or other devices and systems may also include a computer program product including a non-transitory machine-readable medium having stored thereon instructions that may be used to program the digital signal generators or other electronic devices to perform processes described herein such as, for example, delivering low and high-level signals. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the digital signal generators or another electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

FIG. 1 illustrates a simplified representation of a system 100 comprising a line-powered current measurement device 120 mounted to an electrical conductor 154 and an IED 130 consistent with embodiments of the present disclosure. Line-powered current measurement device 120 is mounted to conductor 154, which is suspended between pylons 150, 152. In the illustrated embodiment, only a single line-mounted wireless current transformer is used, and as such, IED 130 may assume that the currents on the other two phases are the same magnitude as the first current but shifted by 120 degrees. In other embodiments, each phase may be associated with a separate line-mounted wireless current transformer. Further, in some embodiments, IED 130 may also measure voltage. In such embodiments, voltage on one phase may be measured, and the voltages of the other phases may be assumed to have the same magnitude as the measured voltage but shifted by 120 degrees. Line-powered current measurement device 120 and IED 130 each contain various subsystems represented by functional blocks. The functional blocks in line-powered current measurement device 120 may communicate using data bus 122, and the functional blocks in IED 130 may communicate using data bus 146.

A wireless communication subsystem 112 may be configured to wirelessly communicate information such as, for example, a current measurement from line-powered current measurement device 120 to IED 130. Wireless communication subsystem 112 may utilize various technologies to enable wireless communication. Such communication may include radio frequency communications and may employ analog or digital modulation techniques and protocols. Wireless communication subsystem 112 may enable transmission of data from line-powered current measurement device 120 related to electrical parameters associated with conductor 154. Such electrical parameters may comprise current measurements, phase measurements, and the like. In some embodiments, wireless communication subsystem 112 may enable bi-directional communication between line-powered current measurement device 120 and IED 130, while in other embodiments, communication may be unidirectional.

A timing subsystem 114 may track the passage of time and provide a consistent time reference with respect to which measurements may be made. In various embodiments, line-powered current measurement device 120 may receive a time signal from IED 130. Further, timing subsystem 114 may use the received time signal to associate various measurements with time stamps according to the time signal received from IED 130. In other embodiments, timing subsystem 114 may comprise an oscillator or other device capable of tracking the passage of time.

A power harvesting subsystem 122 may be capable of harvesting power from conductor 154. In some embodiments, power harvesting subsystem 122 may utilize a current transformer to harvest energy from conductor 154. In various embodiments, the current transformer used to harvest power from conductor 154 may also provide a signal that is analyzed and used to obtain electrical parameter measurements from conductor 154. Power harvesting subsystem 122 may further incorporate a power storage device that may be used to transmit information when current is not flowing through conductor 154 and power cannot be harvested. A power storage device may be embodied as a battery, a supercapacitor, and the like.

A current measurement subsystem 118 may monitor electrical parameters associated with conductor 154. Current measurement subsystem 118 may sample a current flowing through conductor 154 over one or more alternating current (AC) cycles to determine the magnitude and frequency of the AC signal. Such measurements may be transmitted by the wireless communication subsystem 112 to IED 130.

A processing subsystem 110 may be configured to process information received from the current measurement subsystem 118 and the wireless communication subsystem 112. Processing subsystem 110 may operate using any number of processing rates and architectures. Processing subsystem 110 may be configured to perform various algorithms and calculations described herein. Processing subsystem 110 may be embodied as a general-purpose integrated circuit, an application-specific integrated circuit, a field-programmable gate array, and/or any other suitable programmable logic device.

A monitored equipment subsystem 132 may be in communication with monitored equipment operable to control an aspect or a portion of an electrical power system. The monitored equipment subsystem 132 may issue commands to and/or receive status information from monitored equipment. In certain embodiments, monitored equipment subsystem 132 may be in communication with a capacitor bank and may issue commands to selectively connect or disconnect the capacitor bank to control a phase angle between the current and the voltage of an electrical power system.

Timing subsystem 134 may track the passage of time and provide a consistent time reference with respect to which measurements may be made or which communications are received. In some embodiments, timing subsystem 134 may transmit a time signal to line-powered current measurement device 120 that is used to time stamp or time align measurements made by the current measurement subsystem 118. Timing subsystem 134 may receive a time signal from another source (e.g., a GNSS clock signal) or may comprise an oscillator or other device capable of tracking the passage of time.

Processing subsystem 136 may process information received from other subsystems comprised in IED 130. Processing subsystem 136 may operate using any number of processing rates and architectures. Processing subsystem 136 may be configured to perform various algorithms and calculations described herein. In various embodiments, processing subsystem 136 may be embodied as a general-purpose integrated circuit, an application-specific integrated circuit, an FPGA, and/or any other suitable programmable logic device.

A wireless communication subsystem 138 may receive information from and/or send information to line-powered current measurement device 120. Wireless communication subsystem 138 may be compatible with the wireless communication subsystem 112, utilizing the same communication technology and communication protocol(s). In various embodiments, IED 130 may also comprise other communication interfaces (e.g., a wired communication interface) to communicate with other devices, such as other IEDs, a SCADA system, etc.

A control action subsystem 142 may implement control actions based on information received from line-powered current measurement device 120 and other electrical parameters associated with an AC signal on conductor 154. In some embodiments, control action subsystem 142 may control a capacitor bank, which may be selectively activated and deactivated based on electrical conditions. Control action subsystem 142 may issue commands to selectively connect and disconnect the capacitor bank using monitored equipment subsystem 132.

Figure 2:
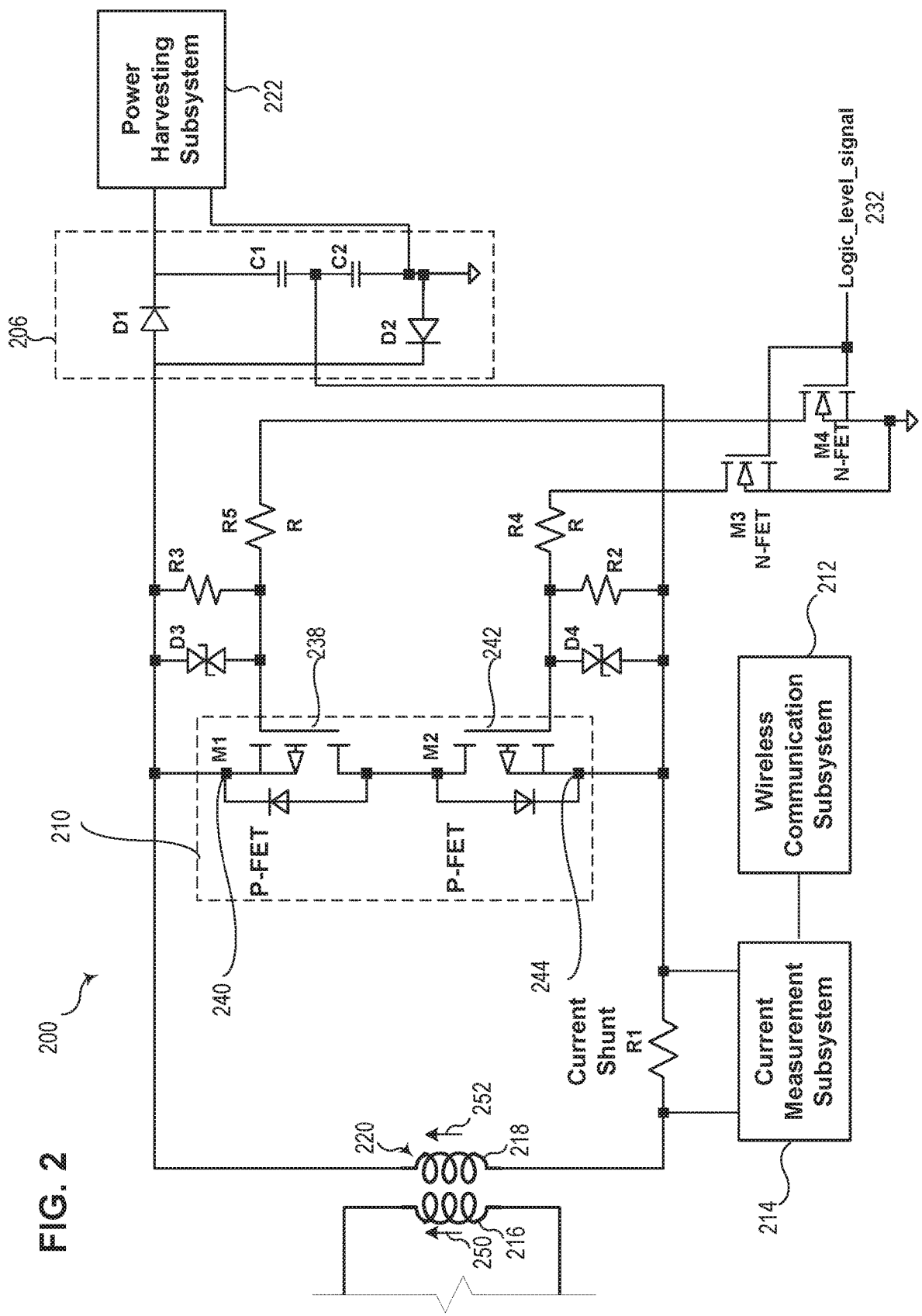
FIG. 2 illustrates a diagram of a line-powered current measurement device that is configurable in a first configuration, in which a current transformer provides power to a power harvesting subsystem, and a second configuration, in which the power harvesting subsystem is bypassed and current from the current transformer is measured by a current measurement subsystem, consistent with embodiments of the present disclosure.

FIG. 2 illustrates a diagram of a system 200 that is configurable in a first configuration, in which a current transformer 220 provides power to a power harvesting subsystem 222, and a second configuration, in which the power harvesting subsystem 222 is bypassed and current from the current transformer 220 is measured by a current measurement subsystem 214 and transmitted by a wireless communication subsystem 212, consistent with embodiments of the present disclosure. System 200 may be used as a line-powered device for measuring electrical parameters. In some instances, system 200 may include more or fewer systems, devices, and/or elements.

In the illustrated embodiment, a primary winding 216 of transformer 220 may be in electrical communication with an electrical power system (not shown). A secondary winding 218 of transformer 220 may be in electronical communication with system 200. Transformer 220 maintains an accurate ratio between currents in the primary winding 216 and the secondary winding 218. The ratio between a current 250 in the primary winding 216 and a current 252 in the secondary winding 218 is proportional to the ratio of turns in the primary winding 216 and the secondary winding 218.

According to the illustrated embodiment, current measurement subsystem 214 is disposed in parallel with a current shunt R1. Accordingly, in this example, R1 and the current measurement subsystem 214 may be used to measure the current 252 flowing through the secondary winding 218. As such, the current measurement subsystem 214 may determine a value of current 252, which is proportional to the current 250 flowing through the primary winding 216. In various embodiments, alternative current measurement subsystems 214 may be utilized.

The power harvesting subsystem 222 may utilize power from transformer 220 to power system 200; however, the load produced by a power harvesting subsystem 222 may decrease the current-sensing accuracy of the device. For example, operation of power harvesting subsystem 222 may reduce the linearity or proportionality of currents 250 and 252. As such, in some cases, the power harvesting subsystem 222 may decrease the current-sensing accuracy of the current measurement subsystem 214. Accordingly, in some cases, system 200 may be configured to limit or remove the effect of the power harvesting subsystem 222 on the current-sensing accuracy of the current measurement subsystem 214.

In certain embodiments, a switching subsystem 210 may transition system 200 between the first configuration and the second configuration. In the illustrated embodiment, the switching subsystem 210 includes p-channel field-effect transistors (P-FETs) M1 and M2. Diode D3 limits a gate-to-source voltage ($V_{GS}$) of M1 and diode D4 limits the $V_{GS}$ of M2. Diodes D3 and D4 provide transient voltage suppression (TVS), and resistors R4 and R5 limit current in diodes D3 and D4, respectively.

In the illustrated embodiment, switching subsystem 210 is actuated by N-FETs M3 and M4, which in turn are controlled by logic level signal 232. When logic level signal 232 is low, the voltage difference between gates 238, 242 of transistors M1 and M2, respectively, and sources 240 and 244, respectively, cause transistors M1 and M2 to operate in the cut-off region. When M1 and M2 operate in the cut-off region, current 252 does not flow through switching subsystem 210. Instead, in this configuration, current 252 flows through the power harvesting subsystem 222. Power harvested by power harvesting subsystem 222 may be used to power system 200. In the illustrated embodiment, a rectifier and voltage-doubling circuit 206 may be electrically coupled to power harvesting subsystem 222.

Continuing with the current example, during periods in which system 200 measures current 252, the logic level signal 232 may be increased. The high logic level signal may cause M3 and M4 to transition to a saturation region. As a result, current 252 may flow with little resistance through switching subsystem 210. The flow of current through switching subsystem 210 bypasses the power harvesting subsystem 222. As such, during the current measurement period, the current 252 may be measured by current measurement subsystem 214 and transmitted by the wireless communication subsystem 212 without the load produced by power harvesting subsystem 222. As noted above, the load produced by power harvesting subsystem 222 may decrease the current sensing accuracy and/or linearity of current measurement subsystem 214.

Figure 3:
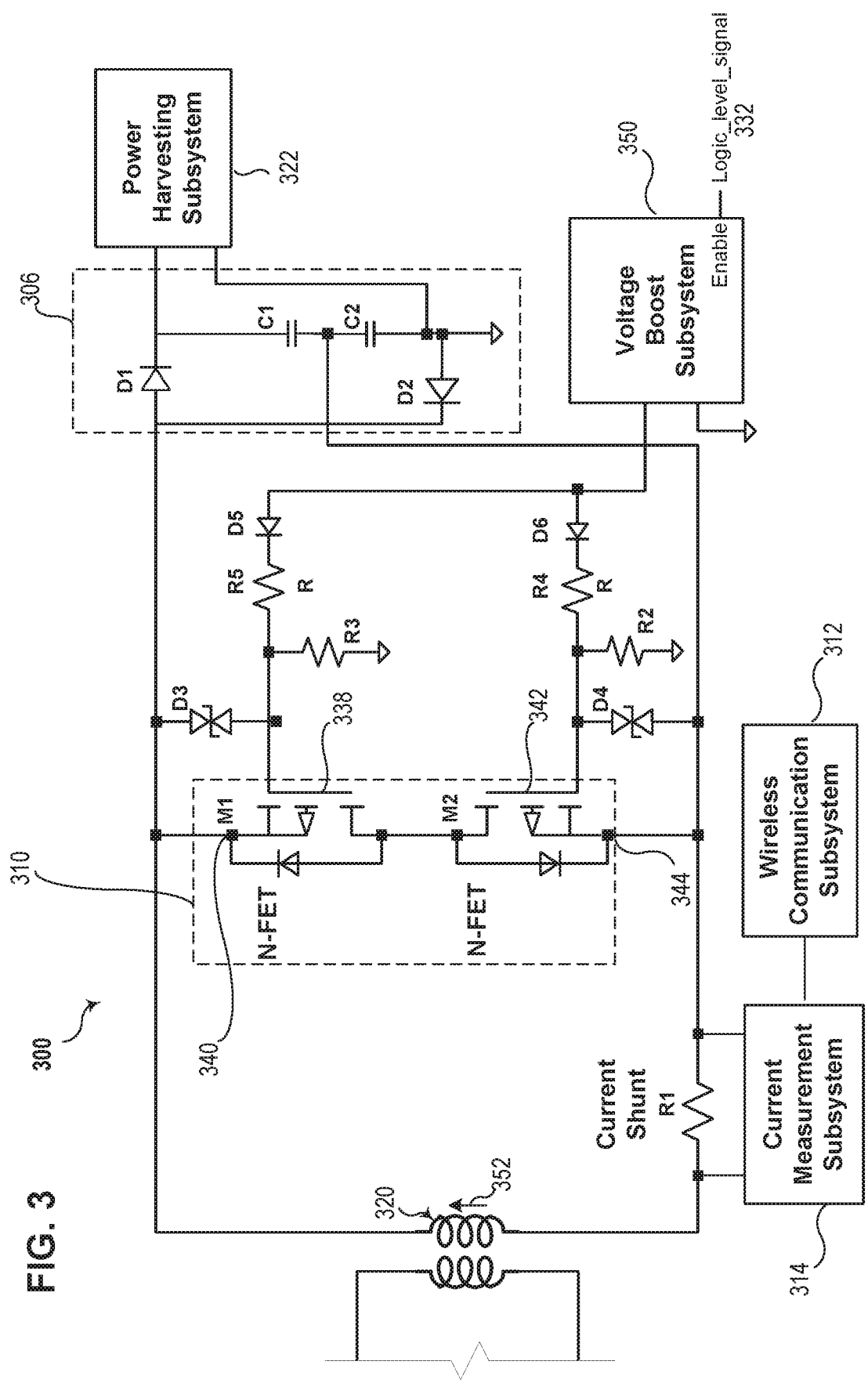
FIG. 3 illustrates a diagram of a line-powered current measurement device that is configurable in a first configuration and a second configuration and further comprising a voltage boost subsystem consistent with embodiments of the present disclosure.

FIG. 3 illustrates a diagram of a line-powered current measurement device 300 that is configurable in a first configuration and a second configuration and further comprising a voltage boost subsystem 350 consistent with embodiments of the present disclosure. System 300 may be used as a line-powered device for measuring electrical parameters associated with an electrical power system. System 300 includes a transformer 320, a current measurement subsystem 314, a wireless communication subsystem 312, a power harvesting subsystem 322, and a rectifier and voltage-doubling circuit 306.

Switching subsystem 310 may transition system 300 between the first configuration and the second configuration. In the illustrated embodiment, switching subsystem 310 is actuated by a voltage boost subsystem 350, which in turn is controlled by logic level signal 332. When logic level signal 332 is low, the voltage difference between gates 338, 342 of transistors M1 and M2, respectively, and sources 340 and 344, respectively, cause transistors M1 and M2 to operate in the cut-off region. When M1 and M2 operate in the cut-off region, current 352 does not flow through switching subsystem 310. Instead, in this configuration, current 352 flows through the power harvesting subsystem 322. Power harvested by power harvesting subsystem 322 may be used to power system 300.

Continuing with the current example, during periods in which system 300 measures current 352, the logic level signal 332 may be increased. As a result, current 352 may flow with little resistance through switching subsystem 310. The flow of current through switching subsystem 310 bypasses the power harvesting subsystem 322. As such, during the current measurement period, the current 352 may be measured by current measurement subsystem 314 and transmitted by the wireless communication subsystem 312 without the load produced by power harvesting subsystem 322.

Figure 4:
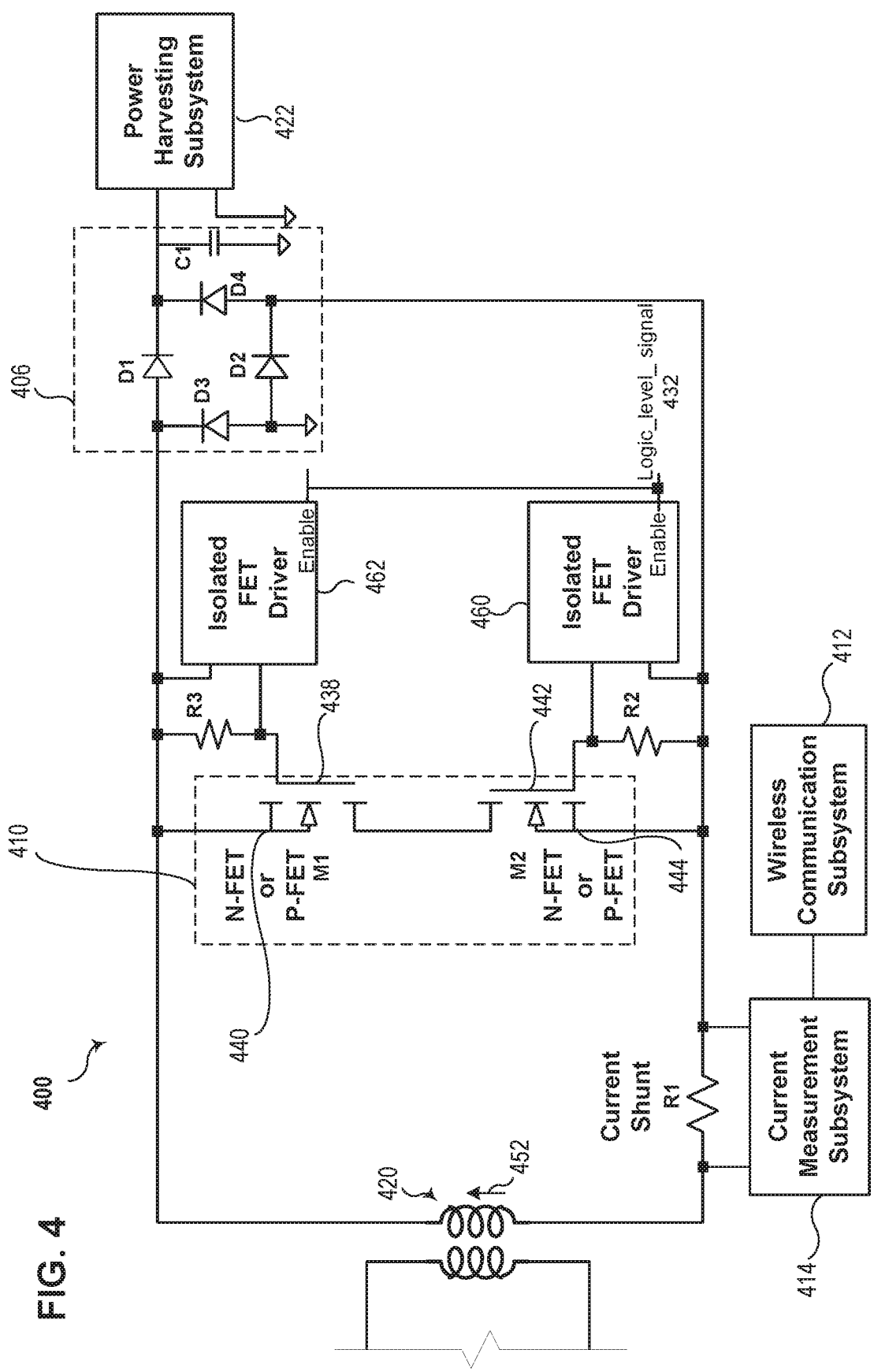
FIG. 4 illustrates a diagram of a line-powered current measurement device that is configurable in a first configuration and a second configuration and further comprising isolated field-effect transistor (FET) drivers to transition between the first configuration and the second configuration consistent with embodiments of the present disclosure.

FIG. 4 illustrates a diagram of a line-powered current measurement device 400 that is configurable in a first configuration and a second configuration and further comprising isolated FET drivers 460, 462 to transition between the first configuration and the second configuration consistent with embodiments of the present disclosure. System 400 includes a transformer 420, a current measurement subsystem 414, a wireless communication subsystem 412, and a power harvesting subsystem 422.

A switching subsystem 410 may transition system 400 between the first configuration and the second configuration. In various embodiments, M1 and M2 of the switching subsystem 410 may include either P-FETs or N-FETs depending on the type of isolated FET drivers 460 and 462 used. In the illustrated embodiment, switching subsystem 410 is actuated by the isolated FET drivers 460 and 462, which in turn are controlled by logic level signal 432. When logic level signal 432 is low, the voltage difference between the gates 438, 442 of transistors M1 and M2, respectively, and the sources 440 and 444, respectively, cause transistors M1 and M2 to operate in the cut-off region. When M1 and M2 operate in the cut-off region, current 452 does not flow through switching subsystem 410. Instead, in this configuration, current 452 flows through the power harvesting subsystem 422. Power harvested by power harvesting sub-system 422 may be used to power system 400. In the illustrated embodiment, a full wave rectifier circuit 406 may be electrically coupled to power harvesting subsystem 422.

Continuing with the current example, during periods in which system 400 measures current 452, the logic level signal 432 may be increased. As a result, current 452 may flow with little resistance through switching subsystem 410. The flow of current through switching subsystem 410 bypasses the power harvesting subsystem 422. As such, during the current measurement period, the current 452 may be measured by current measurement subsystem 414 and transmitted by the wireless communication subsystem 412 without the load produced by power harvesting subsystem 422.

Figure 5:
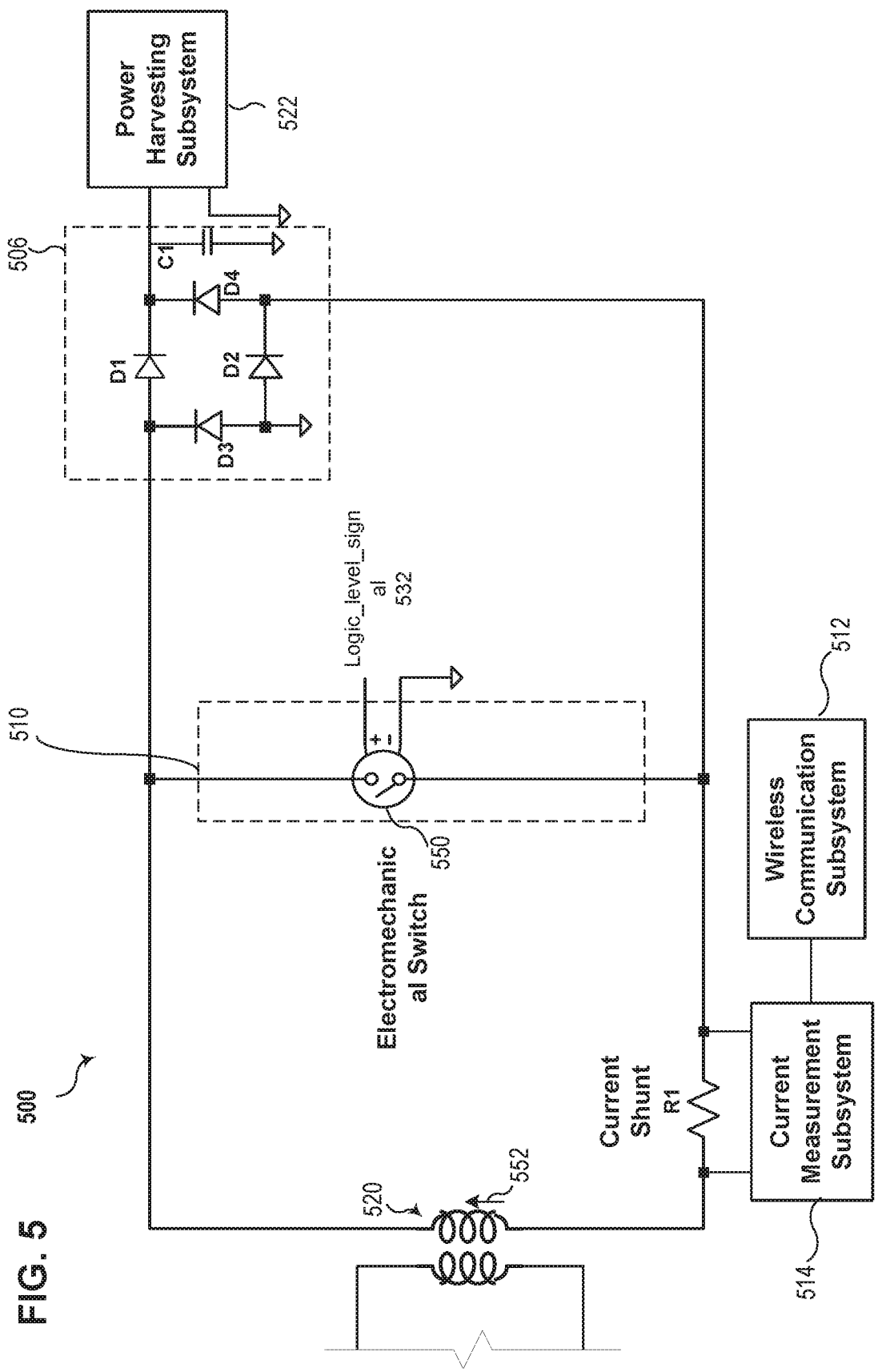
FIG. 5 illustrates a diagram of a line-powered current measurement device that is configurable in a first configuration a second configuration, and further comprising an electromechanical switch to transition between the first configuration and the second configuration consistent with embodiments of the present disclosure.

FIG. 5 illustrates a diagram of a line-powered current measurement device 500 that is configurable in a first configuration a second configuration, and further comprising an electromechanical switch 550 to transition between the first configuration and the second configuration consistent with embodiments of the present disclosure. System 500 includes a transformer 520, a switching subsystem 510, a current measurement subsystem 514, a wireless communication subsystem 512, a power harvesting subsystem 522, and a full wave rectifier circuit 506.

In certain embodiments, an electromechanical switch 550 may transition system 500 between the first configuration and the second configuration. In the illustrated embodiment, the electromechanical switch 550 is actuated by a logic level signal 532. When logic level signal 532 is low, the electromechanical switch 550 opens. Accordingly, current 552 does not flow through the switching subsystem 510. Instead, in this configuration, current 552 flows through the power harvesting subsystem 522.

Continuing with the current example, during periods in which system 500 measures current 552, the logic level signal 532 may be increased. As a result, the electromechanical switch 550 closes, respectively, and current 552 may flow with little resistance through switching subsystem 510. The flow of current through switching subsystem 510 bypasses the power harvesting subsystem 522. As such, during the current measurement period, the current 552 may be measured by current measurement subsystem 514 and transmitted by the wireless communication subsystem 512 without the load produced by power harvesting subsystem 522.

FIG. 6 illustrates a flow chart of a method 600 for operating a line-powered current measurement device in a first configuration, in which a current transformer provides power to a power harvesting subsystem, and a second configuration, in which the power harvesting subsystem is bypassed and current from the current transformer is measured by a current measurement subsystem, consistent with embodiments of the present disclosure. A 602, a secondary current that is proportional to a primary current may be generated using a current transformer. The current transformer may be in electrical communication with an electrical power system.

At 604, power may be harvested using the secondary current while the line-powered current measurement device operates in the first configuration. The power harvesting subsystem may harvest electrical power from the secondary current to power the line-powered current measurement device. In some embodiments, the current harvesting subsystem may include an energy storage device that stores power and may provide stored power when the current harvesting subsystem is not harvesting power.

At 606, a line-powered current measurement device may transition from the first configuration to the second configuration. In the second configuration, method 600 may bypass the power harvesting subsystem using a switching subsystem 608. The power harvesting subsystem may reduce the accuracy and/or linearity of current measurements, and as such, bypassing the power harvesting subsystem may improve the accuracy and/or linearity of current measurements generated at 610.

While specific embodiments and applications of the disclosure have been illustrated and described, it is to be understood that the disclosure is not limited to the specific configurations and components disclosed herein. Accordingly, many changes may be made to the details of the above-described embodiments without departing from the underlying principles of this disclosure. The scope of the present invention should, therefore, be determined only by the following claims.

What is claimed is:

1. A line-powered current measurement system to mount to an electrical conductor, comprising:
   a current transformer to electrically couple to an electrical conductor in electrical communication with a power source and to generate a secondary current proportional to a primary current generated by the power source;
   a power harvesting subsystem to harvest power from the secondary current and to power the line-powered current measurement device while the line-powered current measurement device is in a first configuration;
   a switching subsystem to transition the line-powered current measurement device between the first configuration and a second configuration based on an input;
   a current measurement subsystem to generate a measurement of the secondary current while the line-powered current measurement device is in a second configuration; and
   a communication subsystem to transmit the measurement of the secondary current to a receiver device;
   wherein the secondary current is provided to the power harvesting subsystem in the first configuration and the secondary current bypasses the power harvesting subsystem in the second configuration.

2. The system of claim 1, wherein the switching subsystem comprises a first transistor and a second transistor.

3. The system of claim 2, wherein each of the first transistor and the second transistor comprise one of a p-channel field-effect transistor (P-FET) and an n-channel field-effect transistor (N-FET).

4. The system of claim 2, wherein a first gate of the first transistor is in electrical communication with a first isolated field-effect transistor (FET) driver, and a second gate of the second transistor is in electrical communication with a second isolated FET driver, and each of the first isolated FET driver and the second isolated FET driver is in communication with the input.

5. The system of claim 1, further comprising a transient voltage suppression subsystem.

6. The system of claim 5, wherein the transient voltage suppression subsystem comprises a diode disposed between the current transformer and the switching subsystem.

7. The system of claim 6, further comprising a resistor disposed in series with the diode to limit a current flow through the diode.

8. The system of claim 1, further comprising a timing subsystem to cause the system to generate the measurement of the secondary current and transmit the measurement of the secondary current to a receiver device according to a schedule.

9. The system of claim 1 wherein the power harvesting subsystem comprises a power storage device to store power in the first configuration, and to provide power in the second configuration.

10. The system of claim 1, further comprising a rectifier disposed between the current transformer and the power harvesting subsystem.

11. The system of claim 1, further comprising a voltage-doubling circuit disposed between the current transformer and the power harvesting subsystem.

12. The system of claim 1, wherein the communication subsystem comprises a radio frequency transmitter.

13. A method for measuring an electrical current in an electrical conductor using a line-powered current measurement device mounted to the electrical conductor, comprising:
   generating a secondary current proportional to a primary current using a current transformer;
   harvesting power using the secondary current to power the line-powered current measurement device while the line-powered current measurement device is in a first configuration;
   transitioning the line-powered current measurement device between the first configuration and a second configuration based on an input and using a switching subsystem;
   the line-powered current measurement device measuring the secondary current while the line-powered current measurement device is in a second configuration; and
   transmitting the measurement of the secondary current;
   wherein the secondary current is provided to the power harvesting subsystem in the first configuration and the secondary current bypasses the power harvesting subsystem in the second configuration.

14. The method of claim 13, wherein the switching subsystem comprises a first transistor and a second transistor.

15. The method of claim 13, wherein a first gate of the first transistor is in electrical communication with a first isolated field-effect transistor (FET) driver, and a second gate of the second transistor is in electrical communication with a second isolated FET driver, and each of the first isolated FET driver and the second isolated FET driver is in communication with the input.

16. The method of claim 13, further comprising generating the measurement of the secondary current and transmitting the measurement of the secondary current to a receiver device according to a schedule.

17. The method of claim 13, further comprising storing power in the first configuration using a power storage device to store power in the first configuration and to provide power in the second configuration.

18. The method of claim 13, further comprising providing a full-wave rectifier disposed between the current transformer and the power harvesting subsystem.

19. The method of claim 13, further comprising providing a rectifier and voltage-doubling circuit disposed between the current transformer and the power harvesting subsystem.

20. A line-powered current measurement system to mount to an electrical conductor, comprising:
   a current transformer to electrically couple to an electrical conductor in electrical communication with a power source and to generate a secondary current proportional to a primary current generated by the power source;
   a power harvesting subsystem to harvest power from the secondary current and to power the line-powered current measurement device while the line-powered current measurement device is in a first configuration;
   a rectifier disposed between the current transformer and the power harvesting subsystem;
   a switching subsystem to transition the line-powered current measurement device between the first configuration and a second configuration based on an input, the switching subsystem comprising:

a first field-effect transistor (FET) comprising a first gate, and
a second FET comprising a second gate and disposed in series with the first FET, each of the first FET and the second FET to operate in one of a cutoff region and a saturation region based on an input signal electrically coupled to the first gate and the second gate;
a current measurement subsystem to generate a measurement of the secondary current while the line-powered current measurement device is in a second configuration; and
a measurement transmission subsystem to transmit the measurement of the secondary current to a receiver device;
wherein the secondary current is provided to the power harvesting subsystem in the first configuration and the secondary current bypasses the power harvesting subsystem in the second configuration.

* * * * *